US007756350B2

(12) United States Patent
Vos et al.

(10) Patent No.: US 7,756,350 B2
(45) Date of Patent: Jul. 13, 2010

(54) LOSSLESS ENCODING AND DECODING OF DIGITAL DATA

(75) Inventors: Koen Vos, San Diego, CA (US); Jan Skoglund, San Francisco, CA (US)

(73) Assignees: Global IP Solutions, Inc., San Francisco, CA (US); Global IP Solutions (GIPS) AB, Stockholm (SE)

( * ) Notice: Subject to any disclaimer, the term of this patent is extended or adjusted under 35 U.S.C. 154(b) by 789 days.

(21) Appl. No.: 11/595,995

(22) Filed: Nov. 13, 2006
(Under 37 CFR 1.47)

(65) Prior Publication Data

US 2008/0112632 A1   May 15, 2008

(51) Int. Cl.
*G06K 9/36* (2006.01)
*H04N 7/12* (2006.01)
*G06K 9/46* (2006.01)

(52) U.S. Cl. .................................. 382/248; 375/240.02
(58) Field of Classification Search .................. 382/209, 382/232, 233, 244, 247, 248, 250, 251; 375/240.02–240.04, 240.22, E7.139, E7.157, 375/E7.158; 348/404, 405, 414, 417–419; 704/206, 219, 229
See application file for complete search history.

(56) References Cited

U.S. PATENT DOCUMENTS

| | | | | |
|---|---|---|---|---|
| 5,870,145 A | * | 2/1999 | Yada et al. | 375/240.04 |
| 6,067,118 A | * | 5/2000 | Chen et al. | 375/240.03 |
| 6,094,629 A | * | 7/2000 | Grabb et al. | 704/219 |
| 6,353,680 B1 | * | 3/2002 | Hazra et al. | 382/232 |
| 6,366,614 B1 | * | 4/2002 | Pian et al. | 375/240.02 |
| 6,385,343 B1 | * | 5/2002 | Kuroda et al. | 382/233 |
| 7,046,852 B2 | * | 5/2006 | Kerofsky | 382/233 |
| 2005/0276329 A1 | * | 12/2005 | Adiletta et al. | 375/240.16 |
| 2006/0155531 A1 | | 7/2006 | Miller | |
| 2008/0112632 A1 | * | 5/2008 | Vos et al. | 382/248 |

FOREIGN PATENT DOCUMENTS

EP    0 789 326 A2    8/1997

OTHER PUBLICATIONS

Nicoulin et al., Optical Engineering, vol. 32, No. 7, Jul. 1, 1993, pp. 1438-1450, XP 000382625.
Golchin et al., Lossless Coding of MPEG—1 III Encoded Audio Streams, vol. 2, Jun. 5, 2000, pp. 885-888, XP010504865.
Schuller et al., IEEE Transactions on Speech and Processing, vol. 10, No. 6, pp. 379-390, (Sep. 2002).
Liebchen et al., Institute for Telecommunications, Technical University Berlin Einsteinufer 25, pp. 1-10, 2002.

* cited by examiner

*Primary Examiner*—Amir Alavi
(74) *Attorney, Agent, or Firm*—Birch, Stewart, Kolasch & Birch, LLP (57) ABSTRACT

The disclosure relates to encoding and decoding of digital data, and in particular to lossless arithmetic encoding and decoding of digital data representing audio, image or video data. A probability density function used for lossless arithmetic encoding of digital data is controlled by employing one or more parameters that changes over the set of data to be encoded. A parametric model in the form of an envelope function describes the spread of quantization indices derived from the data in a transform domain. By transmitting the one or more parameters together with the arithmetically encoded data, a receiving decoder may decode the data by exploiting the same parametric model as used by the encoder.

14 Claims, 7 Drawing Sheets

LOSSLESS ENCODING AND DECODING OF DIGITAL DATA

FIELD OF THE INVENTION

The invention generally relates to encoding and decoding of digital data, and in particular to lossless arithmetic encoding and decoding of digital data representing audio, image or video data.

BACKGROUND OF THE INVENTION

Digital data, such as digital audio signals, digital images or digital video, are often encoded to enable efficient storage or transmission. Two fundamentally different approaches in digital data coding are lossless coding and lossy coding. Lossless coding allows for the exact reconstruction of the digital data by the decoder. In contrast, lossy coding introduces irrecoverable errors in the decoded digital data, at the same time enabling more efficient compression. Similar to lossless coding, lossy coding includes a lossless compression, but only for the relevant information in the digital data set, whereas the irrelevant information is discarded. The lossless encoding method, or compression method, defined by the invention disclosed herein can be used for both lossless and lossy digital data coders.

An important application of digital data coding is audio coding of real-time voice communications over packet networks. Here, typically lossy coding is preferred since it results in lower bit rates than lossless coding. In this field of application, the codec is typically optimized for speech signals, combining a good speech quality with a high coding efficiency. For pleasant conversation using such a codec, it is important that the latency in the communications link is kept to a minimum, which requires that the coding and packetization introduce very little delay. The latter can only be achieved by sending out packets at short intervals, such as once every 10 or 20 milliseconds. Another important property of a codec for voice of packet networks is robustness against packet losses, because for many types of networks complete packets may get lost or become severely delayed. This may be provided for by minimizing the dependency in the decoder on previously decoded packets. Robustness against bit errors within a packet, on the other hand, is typically not required, as most packet networks provide error detection and correction. Computational complexity also needs to be kept to a minimum, depending on the hardware that runs the audio codec.

An example of a lossy audio coder is described in "Perceptual Audio Coding Using Adaptive Pre- and Post-Filters and Lossless Compression", IEEE Transaction on Speech and Audio Processing, Vol. 10, No 6, September 2002, by G. D. T. Schuller et al. This audio coder incorporates a lossless compression method to encode the information that is considered relevant. This relevant information is obtained by pre-filtering the audio signal and then quantizing the result. The lossless encoding of the quantization indices is done with the aid of a backward adaptive prediction filter which makes a prediction of the value of each quantization index, based on previously encoded quantization indices. Because the difference between the actual and predicted indices has a smaller spread than the quantization indices themselves, the indices can be more efficiently encoded. Such a backward adaptive prediction filter is not very suitable however for use with short packets of just a few tens of milliseconds. The reason is that when packets are lost, the prediction filter will not be in the correct state for the next packet and the lossless decoder will consequently give erroneous results. This could be resolved by resetting the prediction filter for each new packet, but that would severely reduce coding efficiency. To overcome this problem, the method described in the current invention uses lossless encoding and decoding based on forward adaptive modeling, where each packet is encoded independently of previously encoded packets.

An example of a lossless audio coder is described in "Lossless Transform Coding of Audio Signals", proceedings of the $102^{nd}$ AES Convention, Munich, 1997, by T. Liebchen, M. Purat and P. Noll. This coder uses a Discrete Cosine Transform to convert a block of time samples into a block of frequency coefficients. These frequency coefficients are quantized and the quantization indices are then losslessly encoded. For this purpose, the frequency coefficients are grouped per 32 adjacent coefficients, and it is observed that the coefficients in each group have an almost Laplacian distribution, and can thus be efficiently encoded using Rice coding. For each group a certain Rice code is chosen that matches the distribution within the group best. There are several shortcomings to this scheme however. First of all, Rice codes only exist for discrete values of the standard deviation (spread) of the Laplacian distribution. Second, the method assumes that the statistics are constant over the group of 32 coefficients, and changes abruptly at the boundary between two groups, whereas the real standard deviation will fluctuate from coefficient to coefficient. Finally, the Rice codes work well for Laplacian distributed coefficients but in reality the frequency coefficients are not exactly Laplacian distributed. For all of these reasons, there can be substantial mismatch between the Rice code and the distribution of the coefficients, resulting in a higher bitrate. The method described in accordance with the present invention overcomes each of these limitations.

Arithmetic coding is an efficient scheme for lossless coding, or lossless compression, of a sequence of symbols. The code length will for an arbitrarily sized block of data lie within a few bits of the self-information of the data to be encoded. The use of probability models for the source code alphabet, rather than using pre-stored tables of code words, provide a higher computational burden, but require less memory space as there is no need to store tables with code words. The theory of arithmetic coding is well known to the skilled person. In general, the input data of an encoder is assumed to consist of a sequence of N source symbols $s_1, s_2, \ldots, s_N$. Each symbol $s_i$ comes from an alphabet of K letters $\{a_1, a_2, \ldots, a_K\}$, and the probability $P_i(a_j)$ of each letter $a_j$ is known to the encoder as well as to the decoder. For each symbol $s_i$, the letter probabilities $\{P_i(a_j)\}$ add up to unity. Therefore, the probabilities $\{P_1(a_j)\}$ pertaining to the first symbol $s_i$ define a division of a line segment of length one into intervals of width $P_1(a_j)$. The order of the intervals is taken to be the same as the order of the letters in the alphabet. For the second symbol $s_2$, these intervals is again divided in subintervals of width $P_1(a_j)P_2(a_k)$, and so on for the remaining symbols. The result is a division of the unit interval into adjacent, non-overlapping intervals, with one interval for each possible input sequence. The width of an interval is equal to the likelihood of the corresponding sequence. This method of generating intervals is the essence of arithmetic coding. In practice, rather than finding all possible intervals, it suffices to compute only the interval corresponding to the actual input data.

Thus, arithmetic coding relies on the probabilities of the input symbols. However, in practice, these probabilities are rarely known, instead a model is used that provides an approximation of the true probabilities. Thus, when using the term probability for arithmetic coding, it is in fact referred to some hypothetical probability.

When using arithmetic coding, the efficiency of the code is governed by how the symbol probabilities used in the design of the code are related to the actual probabilities of the symbols that are being coded. If there is a mismatch, the code will on average produce longer code words than necessary and the code will be less efficient in its compression. Hence, to obtain an efficient code, it is crucial to have a description of the data statistics, i.e. the symbol probability, which is as accurate as possible. Traditionally this means that a lot of data is collected and a probability density function (PDF) is determined to fit all data in the set. A problem is however that many real-life data sources, such as audio or images, have characteristics that significantly change over the span of a block of collected data.

SUMMARY OF THE INVENTION

The idea of the present invention is to control a probability density function used for lossless arithmetic encoding of digital data by employing one or more parameters that changes over the set of data to be encoded. A parametric model in the form of an envelope function describes the spread of quantization indices derived from the data as a function in a transform domain. By transmitting the one or more parameters together with the arithmetically encoded data, a receiving decoder may decode the data by exploiting the same parametric model as used by the encoder.

One advantage with the present invention is that the method takes into consideration that the spread in the transform domain, e.g., in the frequency domain, or in the spatial frequency domain, fluctuates for a data block to be encoded. In the prior art, probability density functions are used while generally assuming, or approximating, the spread to be constant over a block. In the prior art, the probability density function is chosen so as to fit all data in the block. Alternatively, improved prior art encoder would use several different probability density functions, each with a respective constant spread. By conditioning the one probability density function with one or more parameters of a parametric model in accordance with the present invention, different statistics for different data points in a block of data to be encoded are obtained. In this way the encoding method of the invention operates more closely with actual probabilities of data to be encoded, resulting in shorter code words than otherwise would be possible. Therefore, a higher degree of compression for the encoding is achieved, and, thus, less bandwidth is needed for transferring the encoded data.

Further features of the invention, as well as advantages thereof, will become more readily apparent from the following detailed description of a number of exemplifying embodiments of the invention. As is understood, various modifications, alterations and different combinations of features coming within the scope of the invention as defined by the appended claims will become apparent to those skilled in the art when studying the general teaching set forth herein and the following detailed description.

BRIEF DESCRIPTION OF THE DRAWINGS

Exemplifying embodiments of the present invention will now be described with reference to the accompanying drawings, in which.

DETAILED DESCRIPTION OF THE INVENTION

Figure 1:
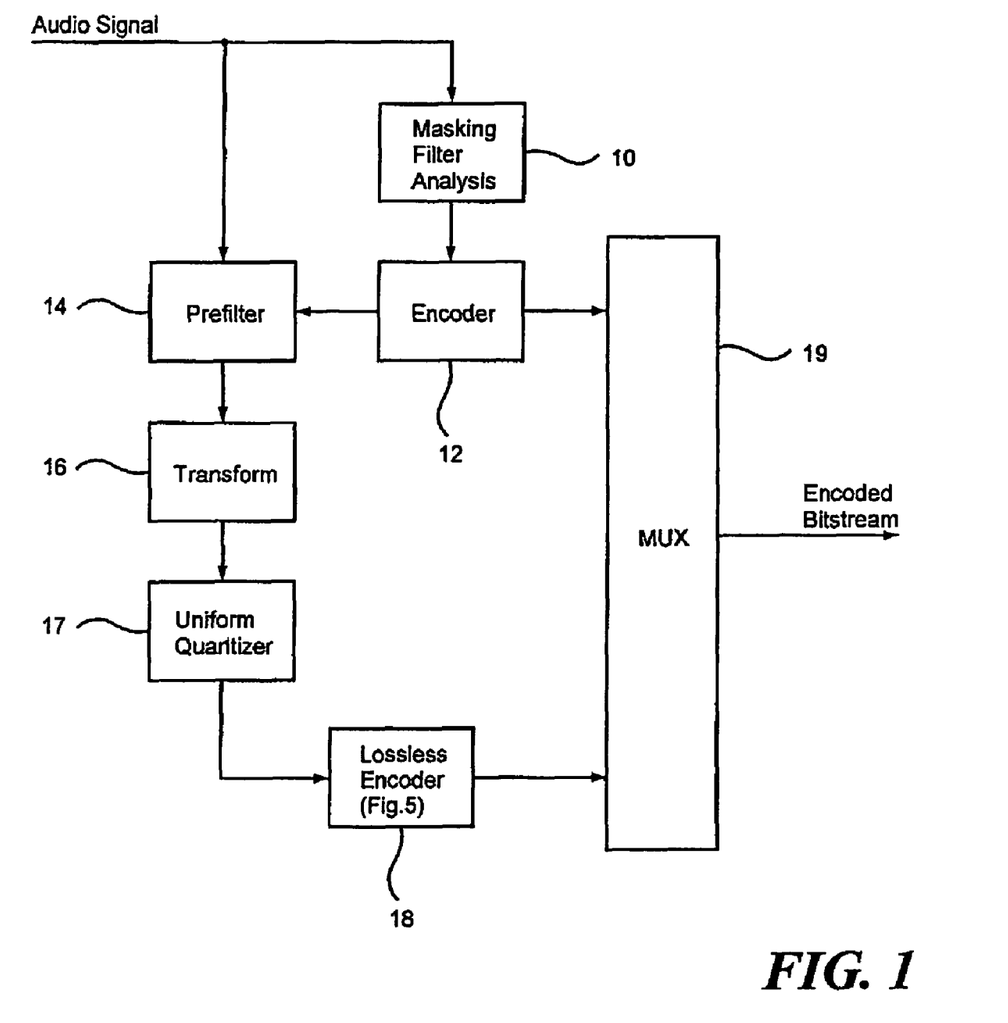
FIG. 1 is a schematic block diagram of a lossy audio encoder which includes a lossless encoder in accordance with an embodiment of the invention.

FIG. 1 is a general block diagram illustrating a system for the encoding of an audio signal according to an embodiment of the present invention. The audio encoder operates on blocks of audio samples. The input audio signal is in a digitized format such as linear Pulse Code Modulation (PCM), and consists of a sequence of numbers, each of which represents an audio sample. The block of audio samples is analyzed by means of a masking filter analysis procedure 10 to obtain a parametric filter representation. An encoder 12 quantizes and encodes the parametric representation for transmission as side information to a decoder. The quantized filter representation is also dequantized and used to configure a pre-filter 14, which shapes the coding noise over time and frequency in a way that benefits the coding process. The pre-filtered block of audio samples is converted into a block of transform coefficients by a suitable transform 16, e.g., into frequency coefficients by a time-to-frequency transform. The resulting transform coefficients are quantized with a uniform scalar quantizer 17 having a quantization step size that is constant for all coefficients and all blocks. Advantageously, the quantizer 17 employs subtractive dithering to reduce musical noise. The block of quantized transform coefficients is encoded by a lossless encoder 18 which is described in detail below. A multiplexer 19 combines the encoded parametric filter representation from the encoder 12 and the encoded transform representation from the lossless encoder 18 into a bitstream available at the output for transmission to the decoder.

Figure 2:
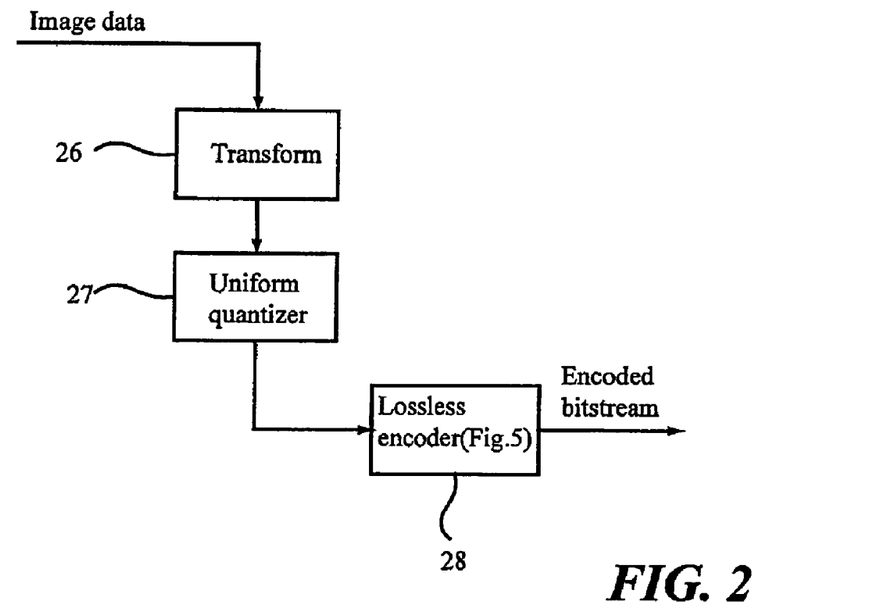
FIG. 2 is a schematic block diagram of a lossy image encoder which includes a lossless encoder in accordance with an embodiment of the invention.

FIG. 2 is a general block diagram for an alternative embodiment illustrating a system for encoding of images in accordance with another embodiment of the present invention. The image encoder operates on blocks of image pixels. The input image data consists of a sequence of numbers, each of which represents intensity or color values of a pixel. Similarly as in the embodiment with audio samples, the block of image pixels is analyzed by means of a masking filter analysis procedure to obtain a parametric filter representation, which parametric representation is quantized and encoded by an encoder (not shown) for transmission as side information to a decoder. The block of pixels is converted into a block of transform coefficients by a suitable transform 26, e.g., into spatial frequency coefficients by a space-to-frequency transformation. The resulting coefficients are quantized with a uniform scalar quantizer 27 having a quantization step size that is constant for all coefficients and all blocks. The block of quantized transform coefficients is encoded by the lossless encoder 28 which is described in detail below. As in the audio embodiment, a multiplexer (not shown) combines the encoded filter representation from the encoder and the encoded transform representation from the lossless encoder 44 into a bitstream for transmission to the decoder.

Figure 3:
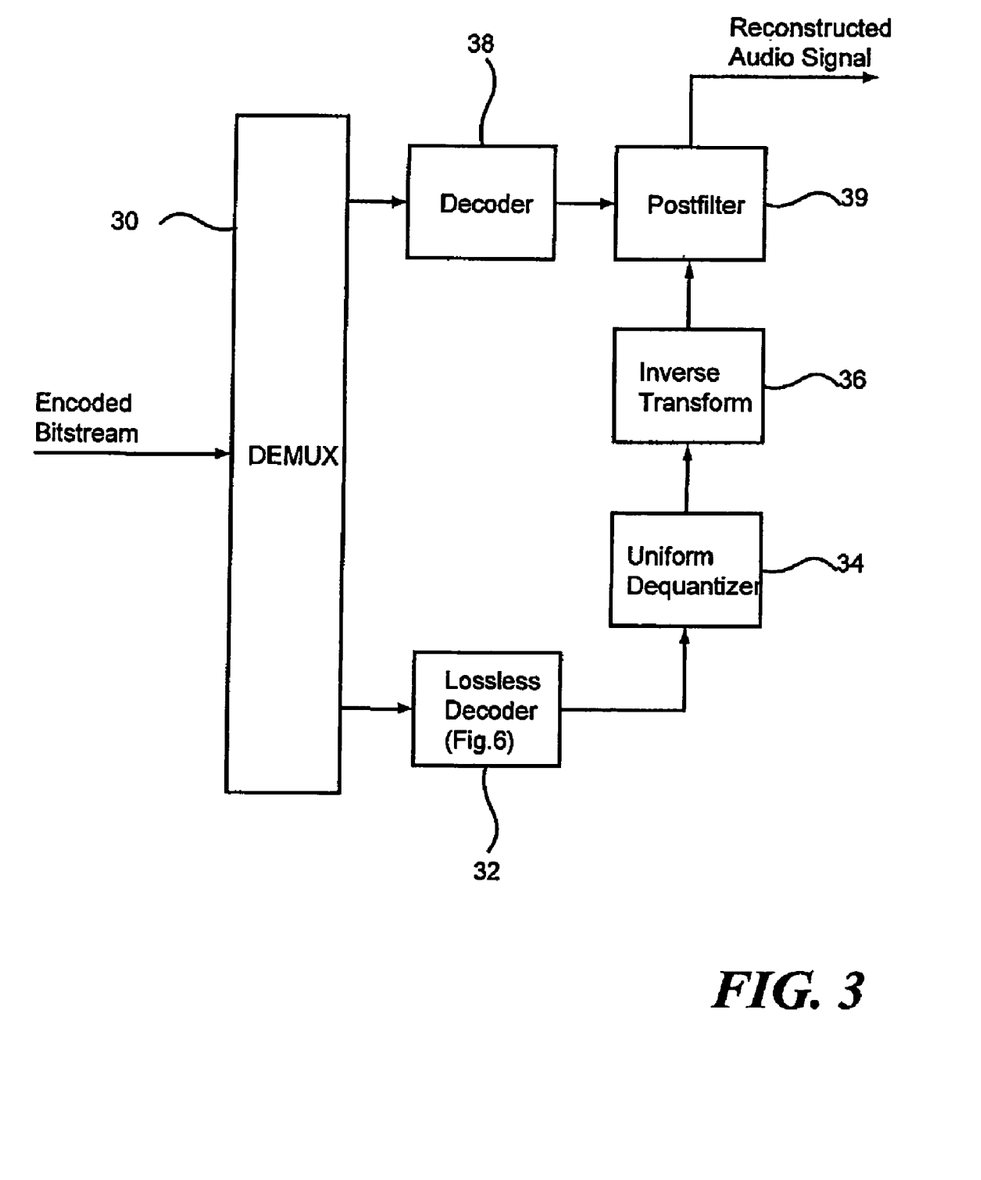
FIG. 3 is a schematic block diagram of a lossy audio decoder which includes a lossless decoder in accordance with an embodiment of the invention.

FIG. 3 is a general block diagram illustrating a system for the decoding of an audio signal from an encoded bitstream in accordance with an embodiment of the invention. This system essentially takes the inverse of each corresponding encoder step, with these steps taken in reverse order. A demultiplexer 30 separates the bitstream available at a decoder input into side information that defines an encoded filter representation, and into a bitstream representing encoded transform coefficients. The bitstream representing the transform coefficients is decoded by a lossless decoder 32 into a block of quantization indices. The lossless decoder 32 is described in detail below. These quantization indices are dequantized in a uniform dequantizer 34 to produce quantized transform coefficients. The inverse transform 36 transforms the quantized transform coefficients back to a block of audio samples in the time domain. The side information defining the filter representation is decoded and dequantized by a decoder 38- and used to configure a post-filter 39 which performs the reciprocal operation of the pre-filter 14 in the corresponding encoder of FIG. 1. The output of the post-filter 39 constitutes the reconstructed audio signal.

Figure 4:
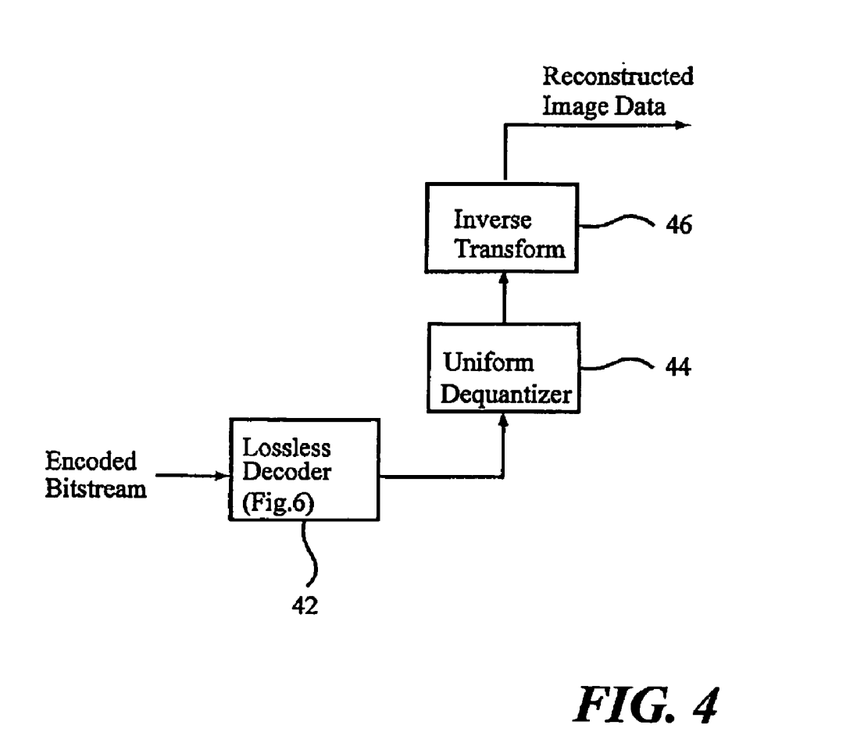
FIG. 4 is a schematic block diagram of a lossy image decoder which includes a lossless decoder in accordance with an embodiment of the invention.

FIG. 4 is a general block diagram illustrating a system for the decoding of image data from an encoded bitstream in accordance with the second embodiment of the invention. This system performs the inverse of the encoding steps discussed with reference to FIG. 2. The demultiplexing, decoding of side information and post filtering are performed in a similar way as discussed in the embodiment of FIG. 3, and are neither repeated here, nor shown in FIG. 4. The bitstream is decoded by a lossless decoder 42 into a block of quantization indices. The lossless decoder 42 is described in detail below. These quantization indices are dequantized in a uniform dequantizer 44 to produce the quantized transform coefficients. An inverse transform 46 transforms the quantized coefficients back to a block of image pixels, e.g., by means of a space-to-frequency transformation.

Figure 5:
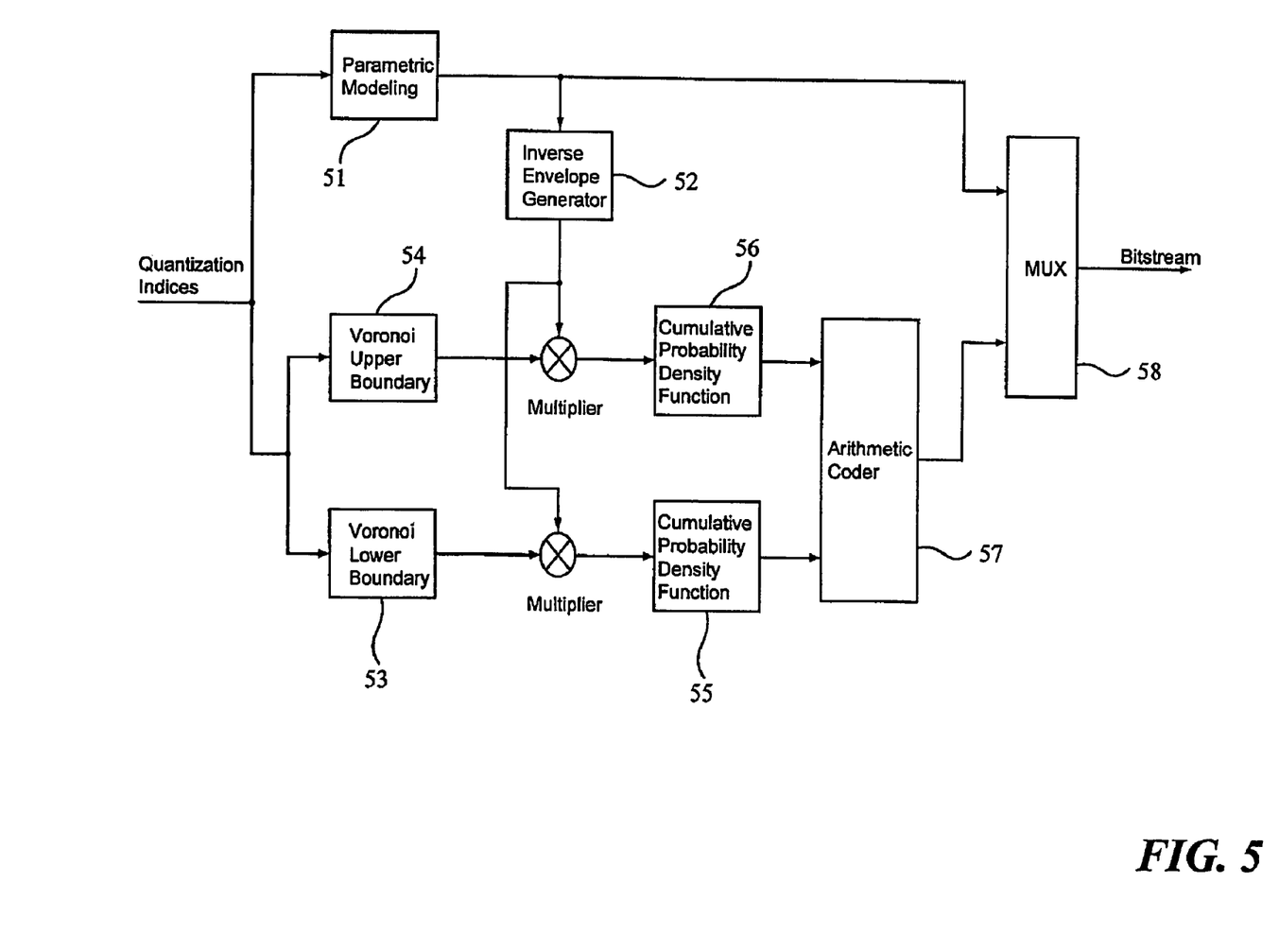
FIG. 5 is a schematic block diagram of the lossless encoder shown in FIGS. 1 and 2.
Figure 7:
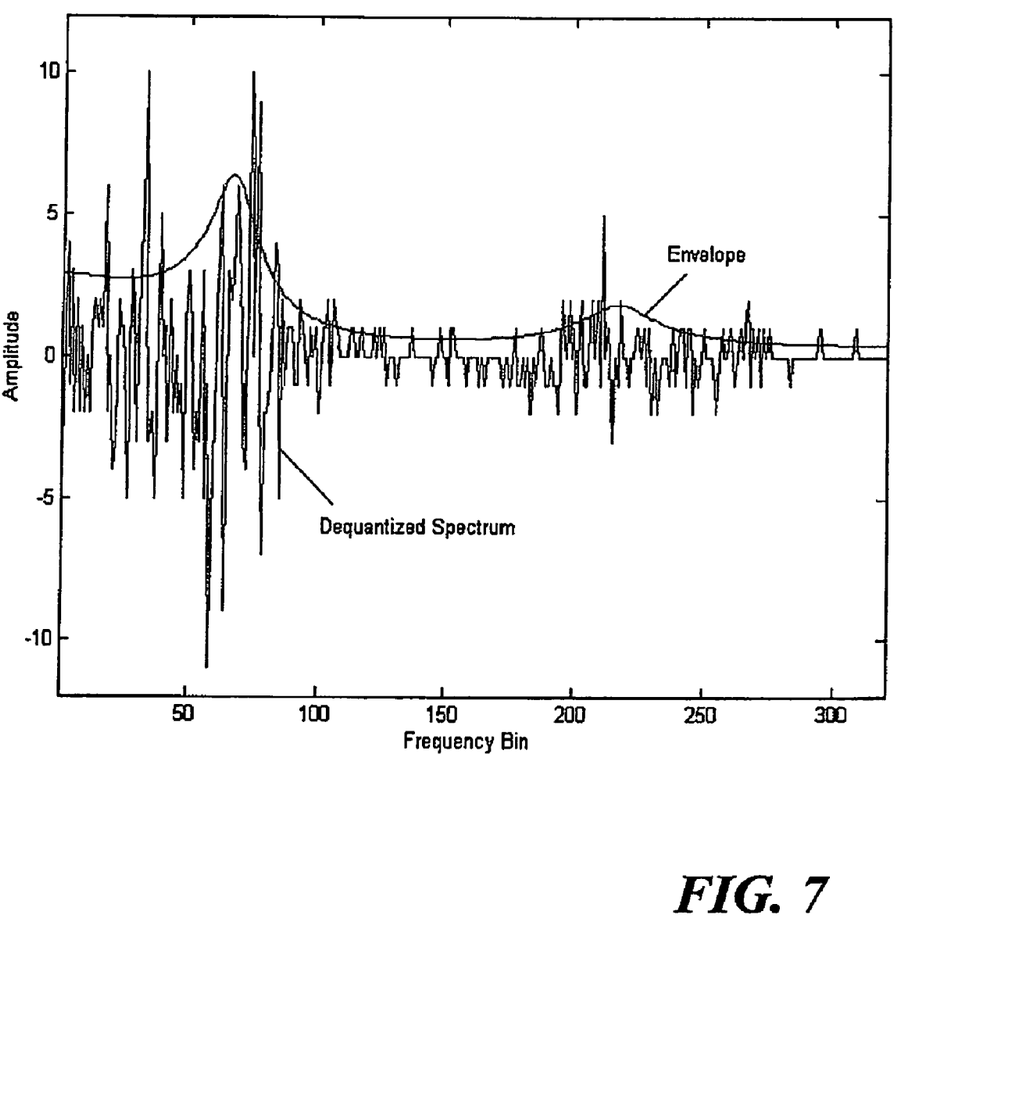
FIG. 7 shows an exemplifying signal spectrum and corresponding envelope signal when the application is audio.
Figure 8:
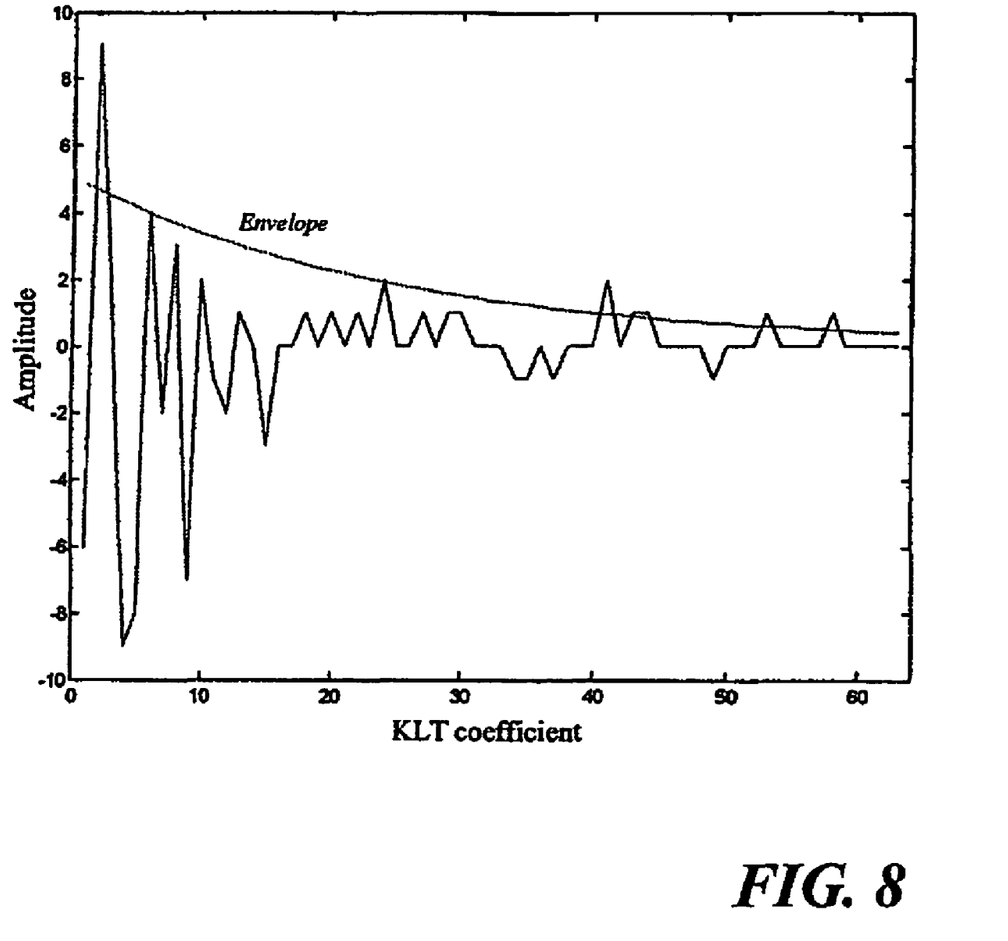
FIG. 8 shows exemplifying quantized image transform coefficients and corresponding envelope when the application is image coding.

FIG. 5 is a block diagram of the lossless encoder shown in FIG. 1 and FIG. 2. The input consists of a block of quantization indices, each index representing a quantized transform coefficient. A parametric modeling module 51 dequantizes the quantization indices and models the spread of the quantized coefficients around zero, as a function of the domain of the transform. For example, for an audio application using a time-to-frequency transform, the lossless encoder input will be quantized frequency coefficients, and the envelope will be a frequency-varying spread function. FIG. 7 shows an example of a dequantized frequency signal with a corresponding envelope signal for a block of audio samples. For an image application using a KLT transform, the corresponding envelope signal for a block of image data is shown in FIG. 8. However, as will be understood by the skilled person, other transforms can be used for audio, image, video or other applications. Thus, even though the preferred envelope models have been mentioned above, the envelope model could e.g., be a function describing signal energies, or signal intensities, or the like.

The function with varying spread in the domain used, or envelope, is described by a number of envelope parameters, and these parameters are quantized and encoded for transmission as side-information to the decoder. Further, an inverse envelope generator 52 uses the quantized envelope parameters to generate the inverse of the envelope function. For each quantization index, the boundaries of the corresponding quantization region are recreated by the modules Voronoi lower boundary 53 and Voronoi upper boundary 54. The definitions of the Voronoi boundaries will be discussed below. The lower and upper boundaries are then multiplied by the value of the inverse envelope function at the position in the transform domain which corresponds to the quantization coefficient. Cumulative probability density functions 55 and 56 convert the multiplied lower and upper boundaries to lower and upper probability values, respectively. These two probability values are passed on to an arithmetic coder 57, which encodes the two probabilities into an arithmetic bitstream. The process of determining the Voronoi boundaries, multiplying by the appropriate inverse envelope value, determining the probability values and arithmetic coding is repeated for all input quantization indices. A multiplexer 58 concatenates the encoded parameters with the arithmetic bitstream to form an output bitstream.

Figure 6:
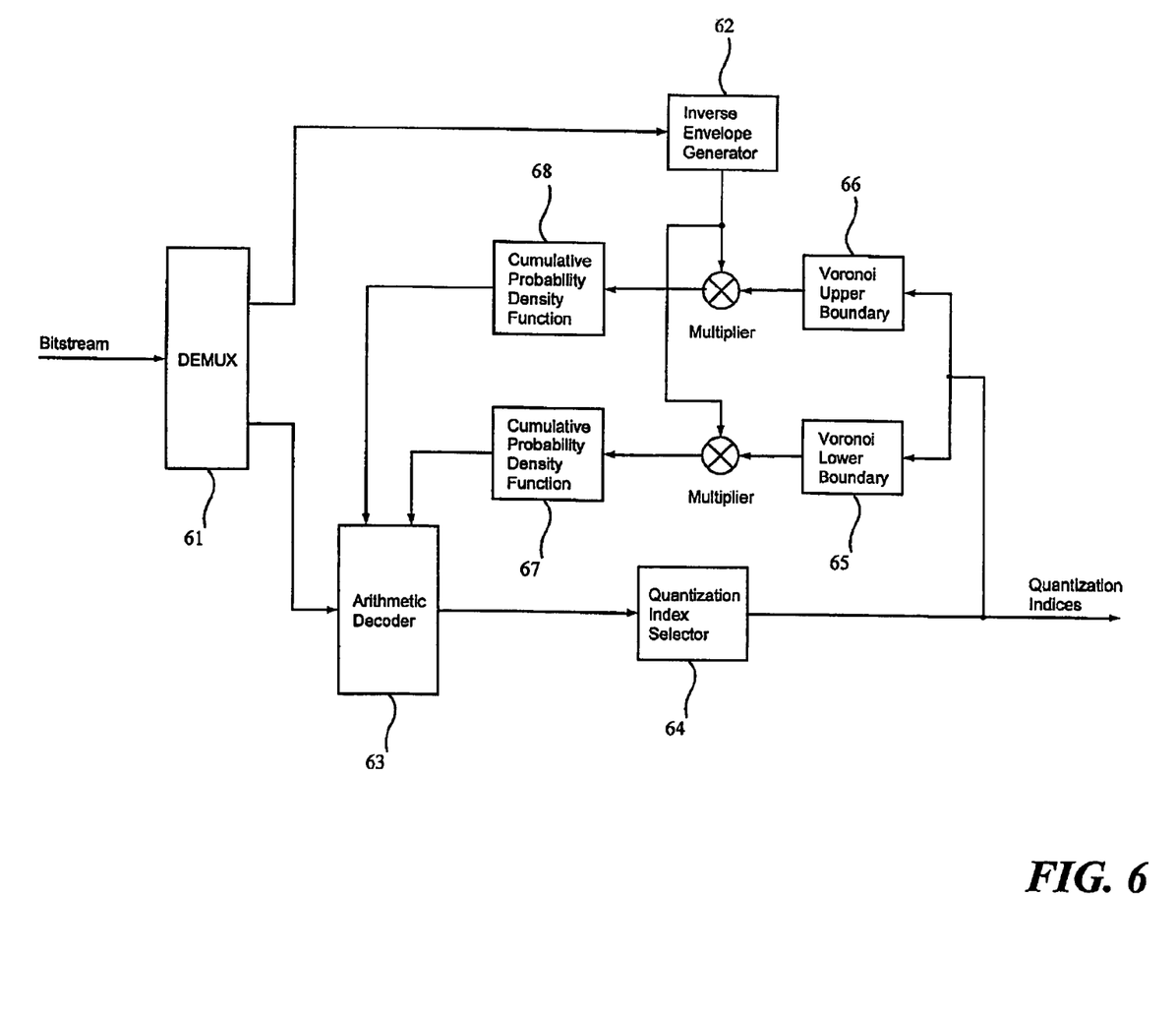
FIG. 6 is a schematic block diagram of the lossless decoder shown in FIGS. 3 and 4.

FIG. 6 is a block diagram illustrating the lossless decoding, or decompression, of quantization indices, as used in the decoder. A demultiplexer 61 separates the input bitstream into a description of the encoded envelope parameters and an arithmetic bitstream. The envelope parameters are decoded and dequantized, and used to calculate the inverse envelope in an inverse envelope generator 62. An arithmetic decoder 63 takes the arithmetic bitstream and determines whether a pair of probability values generated from a tentatively coded quantization index is the same pair as encoded by the arithmetic encoder, with the aid of the inverse envelope values. The arithmetic decoder 63 steers a quantization index selector 64 to adjust the quantization index until a index has been found for which the probability values match the information in the bitstream. For each quantization index tested, the boundaries of the corresponding quantization region are recreated by two modules Voronoi lower boundary 65 and Voronoi upper boundary 66. These lower and upper boundaries are then multiplied by the value of the inverse envelope function at the position in the transform domain which corresponds to the quantization coefficient. Cumulative probability density function 67 and cumulative probability density function 68 convert the multiplied lower and upper boundaries to lower and upper probability values, respectively. When the arithmetic decoder 63 observes that the current value for the quantization index is the correct one, the index is sent to the output and the next quantization is decoded until a complete block of indices has been decoded.

As mentioned above, FIG. 7 illustrates an envelope function in an embodiment relating to audio samples. FIG. 7 shows that the envelope function for a block of quantized frequency coefficients models the spread of the quantized frequency coefficients as a function of frequency. FIG. 8 illustrates an envelope function in an embodiment relating to image pixel data, wherein the envelope function models the spread of a block of quantized KLT transform coefficients. As discussed, the present invention uses one probability density function (pdf), typically a generic pdf, with some variable parameters that are allowed to change over the block. An example of such a generic PDF could be a Gaussian density with control parameters mean and variance. These parameters need to be known and utilized at both the encoder and the decoder. This addition information, or side-information, has to be transmitted to the decoder to efficiently describe the parameter trajectory over the block. In FIG. 8 the data mean is fairly constant (zero) and the only thing that changes is the variance. Thus, this change of variance needs to be described and transmitted to the decoder. In the image coding example of FIG. 8 the variance trace can be modeled by an exponential decaying curve (an envelope) that needs only two parameters, the amplitude and the decay constant, for all the data in the block. A traditional coder would use only one constant variance for the whole block. In the audio coding example of FIG. 7, the variance trace has a different appearance and needs a few more parameters, e.g., an AR curve with four coefficients.

The transform 16 in FIG. 1 can be implemented as a time-to-frequency transform by a discrete cosine transform (DCT), a Fourier transform, a Hadamard transform, or by one of many other possible transforms. The transforms of two consecutive blocks may be operating on overlapping segments of input samples, such as is the case with Lapped Orthogonal Transforms. Typically, and advantageously, the transform is critically sampled which means that the rates of time input samples and frequency output coefficients are equal. An undersampled transform has a lower output rate than input rate, and this implies that information is lost. For an oversampled transform, having a higher output rate than input rate, there exists redundancy between the frequency coefficients which generally increases the bit rate of the coder.

For transforms producing complex coefficients (such as is the case with a Fourier transform), the real and imaginary parts of each complex coefficient are treated as two real-valued quantities, and a block of frequency coefficients is created by interleaving the real and imaginary parts of the complex transform coefficients.

While the embodiment relating to audio coding will be described as using a time-to-frequency transform, audio coding and other applications of the invention may use other transforms. For example, in the embodiment of an image coding system where blocks of image picture elements (pixels) are transformed, quantized, and encoded by the lossless encoder, the transform will be any transform suitable for image coding, common examples being the Karhunen-Loeve Transform (KLT) and the Discrete Wavelet Transform. In the example of FIG. 8, blocks of 8*8=64 pixels are transformed by a KLT, quantized and coded.

The quantization indices discussed herein representing frequency coefficients have preferably been quantized using a scalar quantizer. The main advantage of a scalar quantizer over a vector quantizer is the low complexity, at the cost of a modest penalty in coding efficiency. An encoding method based on scalar quantization that provides an excellent rate-distortion product is given by a uniform scalar quantizer followed by an entropy coder.

In general, before quantization, a signal is referred to as the unquantized signal. Quantizing a signal value results in a quantization index, which in turn can be converted by a dequantizer, for instance using a look-up table, into a representation value, which is also called a quantized value. For a scalar quantizer, a Voronoi region is a section of the range of quantizer input values that all yield the same quantization index, and for which no values outside the section exist that yield the same quantization index. The Voronoi lower and upper boundaries pertaining to a quantizatoin index are the lowest and highest quantizer input levels, respectively, that are quantized to that quantization index.

Dithered quantization is used to alleviate musical noise that arises from spectral quantization. Regular dithering comprises offsetting the Voronoi boundaries by a dither signal but leaving the representation levels unaffected. Advantageously, subtractive dithering can be used, which entails offsetting both the Voronoi boundaries and the representation levels by the same dither signal.

The spread of the quantization indices as a function of location in the block of indices is parametrically modeled with an envelope model. For any given envelope model, an optimization method can analyze the quantization indices and calculate a set of model parameters such that the overall bit rate of the lossless coder is minimized. To save computational complexity however, the analysis method may be simplified to yield parameters that only approximately minimize the overall bit rate.

The envelope model can, for example, be the Auto-Regressive (AR) model, commonly used in spectral estimation. The AR model expresses the envelope as $$\sigma_n = \frac{b}{\left|1 + \sum_{k=1}^{d} a_k e^{-jk\pi \frac{n}{N}}\right|}, n = 0 K N - 1.$$

Here, n indicates the position in the block, N is the block size, for instance 320, j equals the square-root of $-1$, d is the model order, for instance 6, the $a_k$ are the AR coefficients and b is the envelope scale parameter. The d+1 envelope model parameters consists of the $a_k$ and b. The inverse of the envelope, that is, $1/\sigma_n$, is multiplied with the Voronoi boundaries in the lossless coder.

A simple yet effective analysis method that computes the envelope parameters from a block of quantization indices is to calculate the time-autocorrelation coefficients, and then convert these into AR coefficients using the Levinson-Durbin recursion. The details of this analysis method are described next. The quantization indices are first dequantized, $$s_n = Q^{-1}(q_n),$$

where $q_n$ is the nth quantization index, and $s_n$ is the quantized frequency coefficient. Then we calculate the time-domain autocorrelation coefficients using the Einstein-Wiener-Khinchin formula $$c_k = \frac{1}{N} \sum_{n=0}^{N-1} s_n^2 \cos\left(\pi \frac{n}{N-1} k\right), k = 0 K d.$$

Here we assume that the $s_n$ represent a proper signal spectrum such as obtained from a Fourier transform. However, the method works for any signal although the resulting $c_k$ may not represent true time-domain autocorrelation coefficients. The division by N normalizes the correlation coefficients to a per-sample quantity.

From the correlation coefficients $c_k$, the AR coefficients $a_k$ can be obtained using the well-known Levinson-Durbin recursion. The first AR coefficient, $a_k$, is always equal to 1.0 and therefore does not need to be encoded. The envelope scale factor is given by $$b = \sqrt{c_0 + \sum_{k=1}^{d} a_k c_k}.$$

The envelope scale factor is thus equal to the square-root of the prediction error variance for the dth order minimum mean-square error linear predictor.

The envelope parameters $a_k$ and b are encoded and transmitted to the decoder. This parameter encoding often consists of the three steps of transformation, quantization and entropy coding; the first and last of these steps are not strictly necessary. For the parameters $a_k$, the transformation can for example be a conversion of the AR coefficients to Log Area (LAR) coefficients or Line Spectral Frequencies (LSFs). The scale factor b can be transformed by a logarithmic mapping. The quantization is either a scalar or vector quantizer and converts the transformed parameters in one or more quantization indices. These quantization indices can then be entropy coded with, for example, a Huffman or arithmetic coding.

The lossless coding of the input quantization indices $q_n$ with an arithmetic coder requires a probability model, which specifies the likelihood of each possible quantization index value, for all locations n in the block of N quantization indices. The model used here assumes a conditional probability density function (pdf) $p(f_n|\sigma_n)$ for the unquantized frequency coefficients $f_n$. For each frequency coefficient, the conditional pdf is obtained by scaling an unconditional pdf according to the envelope $\sigma_n$ discussed above $$p(f_n | \sigma_n) = \frac{1}{\sigma_n} p\left(\frac{f_n}{\sigma_n}\right)$$

This formula simple expresses that the conditional pdf is equal to the unconditional pdf scaled in width by the envelope $\sigma_n$. In order to retain a proper pdf having a total area underneath the curve of 1, the height needs to be scaled by the inverse envelope $$\frac{1}{\sigma_n}.$$

The modeled likelihood of a certain quantization index $q_n = Q(f_n)$ is now given by the integral of the conditional pdf over the Voronoi region pertaining to that quantization index $$P(q_n | \sigma_n) = \int_{L(q_n)}^{U(q_n)} p(\tau | \sigma_n) d\tau$$
$$= \int_{L(q_n)}^{U(q_n)} \frac{1}{\sigma_n} p\left(\frac{\tau}{\sigma_n}\right) d\tau$$
$$= \int_{L(q_n)/\sigma_n}^{U(q_n)/\sigma_n} p(\tau) d\tau$$
$$= C\left(\frac{U(q_n)}{\sigma_n}\right) - C\left(\frac{L(q_n)}{\sigma_n}\right),$$

where U(q) and L(q) represent the upper and lower Voronoi boundary values pertaining to the quantization index q, $P(q_n|\sigma_n)$ is the conditional probability mass function (cmf), and C(x) is the cumulative density function (cdf) defined as $$C(x) = \int_{-\infty}^{x} p(\tau) d\tau.$$

The probability model can for example be based on a Gaussian probability distribution, in which case the cdf is $$C(x) = \int_{-\infty}^{x} \frac{1}{\sqrt{2\pi}} e^{-\frac{1}{2}t^2} dt.$$

Many other distributions can be used instead, such as the logistic distribution, the Laplace distribution, etc.

Advantageously, a cdf can be optimized with a database of training data, for instance by implementing the cdf as a piecewise linear curve. The optimization finds the cdf that minimizes the total modeled entropy $$H = \sum \sum_{n=0}^{N-1} -P(q_n | \sigma_n) \log(P(q_n | \sigma_n)),$$

where the first summation sums over all signal blocks in the training database, and the second summation sums over the quantization indices within each block. This training of the cdf is done off-line and only once, and can be implemented with a straightforward numerical optimization procedure such as a gradient descent algorithm. By using a sufficiently large and diverse database, the trained cdf will provide a match to the probabilities encountered during operation, and thus minimizes the average bit rate.

The modeled probability values are used by the arithmetic coder to generate an efficiently encoded bitstream. The arithmetic coder needs a cumulative mass function (cmf) for each symbol to be encoded, which is directly obtained by evaluating the cdf at the values of the scaled Voronoi boundaries $$P(Q < q_n) = C\left(\frac{L(q_n)}{\sigma_n}\right)$$

and $$P(Q \le q_n) = C\left(\frac{U(q_n)}{\sigma_n}\right).$$

The decoder has access to the exact same cmf because it uses the same envelope and the same Voronoi boundaries. By testing different choices for the quantization index, it can determine the index for which the cmf values match the bitstream information.

It should be noted that the detailed description above of different embodiments of the invention has been given by way of illustration only and that these therefore are not intended to limit the scope of the invention, as it is defined by the appended claims. Furthermore, it will be appreciated that various alterations and modifications falling within the scope of the appended claims will become apparent to those skilled in the art when studying the claims and the detailed description.

For instance, instead of having a single fixed cdf, it is possible to have several different cdf functions available, and for each block choose the one cdf that leads to the lowest bit rate. This decision is then indicated as side information to the decoder.

Alternatively, several different cdf functions can be used, and the cdf chosen for coding one quantization index depends on the level of the corresponding envelope value. In other words, the range of envelope values is divided in regions, and each region is assigned a specific cdf. Each of these cdf functions can be optimized independently, leading to a lower average bit rate. With this approach no additional side information is indicated to the decoder.

Alternatively, a prediction of the unquantized value pertaining to the current quantization index can be made, based on symbols within the block that have already been coded. This prediction value is then subtracted from the Voronoi boundaries in the lossless encoder and decoder. As a result, the Voronoi boundaries will typically be moved closer to zero, where the cdf is steeper. This increases the modeled likelihood of the symbols and therefore reduces the bit rate. The use of prediction in lossless encoding is well-known in the field.

While each of the above extensions lowers the average bit rate, it also increases complexity. For applications demanding a low-complexity codec, the higher complexity is often not justified by the lower bit rate.

The invention claimed is:

1. A method of lossless encoding of a block of quantization indices in a transform domain for transmission as a bitstream, the method including:
    modeling the spread of the quantization indices with an envelope function which is described by at least one envelope parameter;
    for each quantization index:
        recreating an upper boundary and a lower boundary of a quantization region corresponding to the index;
        determining a respective value of the at least one envelope parameter value at a position of the envelope function that corresponds to the index; and
        determining upper and lower probability values for the index by multiplying said upper and lower boundaries with the inverse of the determined at least one parameter value; and
        arithmetically encoding the upper and lower probability values for the index,
    encoding the at least one envelope parameter describing the envelope function; and
    providing a bitstream for transmission to a decoder, which bitstream includes the arithmetically encoded quantization indices and the encoded at least one envelope parameter.

2. The method of claim 1, wherein the quantization indices represent an audio signal, the method including performing a time-to-frequency transformation of digitized audio samples to obtain frequency coefficients and then quantizing the frequency coefficients, wherein said step of modeling the spread of the quantization indices comprises modeling the spread of the quantized frequency coefficients.

3. The method of claim 1, wherein the quantization indices represent a pixel based image, the method including performing a space-to-frequency transformation of digitized pixel data to obtain spatial frequency coefficients and then quantizing the spatial frequency coefficients, wherein said step of modeling the spread of the quantization indices comprises modeling the spread of quantized spatial frequency coefficients.

4. The method of claim 1, wherein said upper and lower probability values are values of a cumulative probability density function.

5. The method of claim 4, wherein the probability model of the cumulative probability density function is based on a distribution included in the set of: Gaussian probability distribution, a logistic distribution and a Laplace distribution.

6. The method of claim 1, wherein said at least one envelope parameter include an envelope scale parameter.

7. The method of claim 6, wherein the envelope model is an Auto-Regressive, AR, model and the envelope parameters include AR coefficients.

8. A method of lossless decoding of a block of quantization indices in a transform domain received as a bitstream, the method including:
    separating a received bitstream into an arithmetic bitstream and a description of at least one encoded envelope parameter;
    decoding the at least one envelope parameter;
    determining an envelope function based on the at least one envelope parameter, the envelope function modeling the spread of coded quantization indices;
    for each quantization index to be decoded:
        arithmetically decoding a pair of upper and lower probability values from the arithmetic bitsream;
        tentatively coding a quantization index by recreating an upper boundary and a lower boundary of a quantization region corresponding to the index, determining a respective value of the at least one envelope parameter value at a position of the envelope function that corresponds to the index, and determining upper and lower probability values for the index by multiplying said upper and lower boundaries with the inverse of the determined at least one parameter value;
        adjusting the quantization index and repeating the step of tentatively coding the index until the upper and lower probability values for the tentatively coded index match the decoded pair of upper and lower probability values from the arithmetic bitsream; and
        outputting the quantization index that resulted in a match.

9. The method of claim 8, wherein the quantization indices to be decoded represent quantized frequency coefficients of an audio signal, the envelope function modeling the spread of coded quantization indices as a function of frequency, the method including performing a frequency-to-time transformation of the output quantization indices to obtain digitized audio samples of an audio signal.

10. The method of claim 8, wherein the quantization indices to be decoded represent quantized spatial frequency coefficients of a pixel based image, the envelope function modeling the spread of coded quantization indices as a function of spatial frequency, the method including performing a frequency-to-space transformation of the output quantization indices to obtain digitized pixel data of a pixel based image.

11. The method of claim 8, wherein said upper and lower probability values are values of a cumulative probability density function.

12. The method of claim 11, wherein the probability model of the cumulative probability density function is based on a distribution included in the set of: Gaussian probability distribution, a logistic distribution and a Laplace distribution.

13. The method of claim 8, wherein said at least one envelope parameter include an envelope scale parameter.

14. The method of claim 13, wherein the envelope model is an Auto-Regressive, AR, model and the envelope parameters include AR coefficients.

* * * * *